(12) United States Patent
Flores et al.

(10) Patent No.: US 12,301,229 B2
(45) Date of Patent: May 13, 2025

(54) ADAPTIVE VOLTAGE SCALING USING TEMPERATURE AND PERFORMANCE SENSORS

(71) Applicant: TEXAS INSTRUMENTS INCORPORATED, Dallas, TX (US)

(72) Inventors: Jose Luis Flores, Richardson, TX (US); Anthony Martin Hill, Dallas, TX (US); Francisco Adolfo Cano, Sugar Land, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/369,360

(22) Filed: Mar. 29, 2019

(65) Prior Publication Data

US 2019/0229732 A1     Jul. 25, 2019

Related U.S. Application Data

(62) Division of application No. 14/103,171, filed on Dec. 11, 2013, now abandoned.

(Continued)

(51) Int. Cl.
*G06F 1/324*     (2019.01)
*G01R 31/317*     (2006.01)
(Continued)

(52) U.S. Cl.
CPC ... *H03K 19/0016* (2013.01); *G01R 31/31725* (2013.01); *G01R 31/31727* (2013.01);
(Continued)

(58) Field of Classification Search
CPC .......... H03K 19/0016; G01R 31/31725; G01R 31/31727; G06F 1/206; G06F 1/324; G06F 1/3296; Y02D 10/00
(Continued)

(56) References Cited

U.S. PATENT DOCUMENTS 7,417,482 B2    8/2008   Elgebaly et al.
2005/0116765 A1   6/2005   Sakiyama et al.
(Continued)

FOREIGN PATENT DOCUMENTS

JP      2004179320 A   *   6/2004

*Primary Examiner* — Mohamed Charioui
*Assistant Examiner* — Xiuqin Sun
(74) *Attorney, Agent, or Firm* — Michael T. Gabrik; Frank D. Cimino

(57) ABSTRACT

An adaptive voltage scaling technique includes using a temperature sensor arranged on a semiconductor die to determine a current die temperature of the semiconductor die, using a performance sensor arranged on a semiconductor die to determine a current performance metric of the semiconductor die, determining whether the current performance metric matches an expected performance metric based at least partially on the current die temperature and, if the current performance metric does not match the expected performance metric, indicate a performance sensor error, when a performance sensor error is indicated, determining an updated power supply voltage for correcting the performance sensor error, and causing a current power supply voltage supplied by a power supply voltage source of the semiconductor die to be changed to the updated power supply voltage.

15 Claims, 3 Drawing Sheets

Related U.S. Application Data

(60) Provisional application No. 61/736,217, filed on Dec. 12, 2012.

(51) Int. Cl.
*G06F 1/20* (2006.01)
*G06F 1/3296* (2019.01)
*H03K 19/00* (2006.01)

(52) U.S. Cl.
CPC .............. *G06F 1/206* (2013.01); *G06F 1/324* (2013.01); *G06F 1/3296* (2013.01); *Y02D 10/00* (2018.01)

(58) Field of Classification Search
USPC .......................................... 327/513; 702/107
See application file for complete search history.

(56) References Cited

U.S. PATENT DOCUMENTS

| | | |
|---|---|---|
| 2006/0020838 A1 | 1/2006 | Tschanz et al. |
| 2008/0077348 A1* | 3/2008 | Hildebrand ............... G06F 1/32 714/E11.154 |
| 2008/0104561 A1* | 5/2008 | Carpenter ........... G06F 30/3312 716/104 |
| 2010/0138684 A1 | 6/2010 | Kim et al. |
| 2011/0004774 A1* | 1/2011 | Hansquine .............. G06F 1/324 713/300 |
| 2013/0007543 A1 | 1/2013 | Goss et al. |

\* cited by examiner

ADAPTIVE VOLTAGE SCALING USING TEMPERATURE AND PERFORMANCE SENSORS

CROSS-REFERENCE TO RELATED APPLICATION(S)

This application is a divisional of U.S. patent application Ser. No. 14/103,171 filed on Dec. 11, 2013, which claims priority to U.S. Provisional Application No. 61/736,217 filed on Dec. 12, 2012, all of which are incorporated herein by reference.

TECHNICAL FIELD

The technical field of this invention is adaptive voltage scaling.

BACKGROUND OF THE INVENTION

Frequency and voltage scaling are commonplace in electronic processors. These devices are providing more and more functionality and demand the highest data processing efficiency. Adaptive Voltage Scaling (AVS) provides the lowest operation voltage for a given processing frequency by utilizing a closed loop approach. The AVS loop regulates processor performance by automatically adjusting the output voltage of the power supply to compensate for process and temperature variation in the processor. In addition, the AVS loop trims out power supply tolerance. When compared to open loop voltage scaling solutions like Dynamic Voltage Scaling (DVS), AVS uses up to 45% less energy.

Power savings is further optimized by partitioning the SoC design into several independent voltage domains. For example, the processor may have a core and a hardware accelerator that operate on different scaling voltage domains. The AVS enables control of multiple AVS domains, commonly needed in state-of-the-art SoC design.

The way to reduce energy consumption in a processor, is to not only reduce the clock frequency as low as possible, but, more importantly, to reduce the core supply voltage to the minimum amount for a given clock frequency.

FIG. 1 illustrates the energy savings gained with voltage scaling where curve 101 is without AVS and curve 102 is with AVS enabled.

A simple approach to AVS is to generate a voltage vs. frequency table. These voltages are the minimum needed to maintain functionality over all parts and temperature.

While open loop AVS can yield a good amount of energy savings, it does not realize all the energy savings available. Alternately, a closed loop approach may also be used where the performance of the logic is measured to assist in deriving the minimum acceptable voltage for satisfactory operation.

Every operating frequency/voltage pair in a processor must be characterized such that over parts and temperature the operating voltage is high enough to meet timing criteria.

This characterized voltage must also include headroom for power supply regulation error (typically 5 to 10%). Accounting for process, temperature, and power supply variation, the table based AVS is at best conservative, and requires characterization at all the operating frequencies.

SUMMARY

An adaptive voltage scaling method is shown using lookup table based manufacturing characterization and a set of precision analog temperature sensors on the die to generate a voltage indexed by temperature look-up table that will use the measured temperature in the die to index and request the correct operation voltage at any given temperature for a given frequency operation point.

BRIEF DESCRIPTION OF THE DRAWING

These and other aspects of this invention are illustrated in the drawing, in which.

DETAILED DESCRIPTION

Adaptive Voltage Scaling (AVS) technology may be built around a scalable architecture, which can offer the ability to adjust the power supply based on silicon strength, compensate for temperature, and remove system power supply margins.

The large SoCs currently integrate hundreds of millions of transistors, and operate with high power levels. Frequently the contribution of leakage power to the total power budget is significant. Additionally, many of the functional units of the SoC have fixed performance requirements, e.g., USB2.0 is always limited to 480 Mbits/s. Since the worst case leakage occurs with faster silicon, these devices traditionally exhibit the highest power.

Eliminating the performance headroom of these devices by lowering the supply voltage allows them to achieve lower power for the same function. The design goal of the Texas Instruments SmartReflex AVS technology was to effectively nullify the impact of leakage on customer's power budgets by lowering the voltage on faster silicon such that their total power was lower than the slowest silicon.

Temperature impact to performance varies with the operating voltage. At higher voltages, the logic gates slow as temperature increases, while at lower voltages, they speed up as temperature is increased. This is due to the opposing effects of threshold voltage variation and carrier mobility (threshold voltage decreases with increasing temperature, mobility decreases with increasing temperature). The margin required to guarantee device performance over the operating range can be relatively large; for this reason AVS allows for the automatic adjustment of the power supply in response to temperature changes of the silicon.

Power delivery includes many discrete components. Each of these has its own tolerances and variations, and is traditionally assumed to be at worst case when deriving system power delivery budgets. In practice, some or all of the components will not be at the worst case conditions, and in fact some are even mutually exclusive, e.g., while performance may be worst case at low temperature, the resistance of the copper interconnect lines is around 30% lower when compared to high temperature, hence the IR drop in the board and package routing is reduced at low temperature, thus offsetting the performance loss. The closed loop AVS system automatically corrects for these factors since it monitors logic performance at the end point of the power delivery network.

Figure 2:
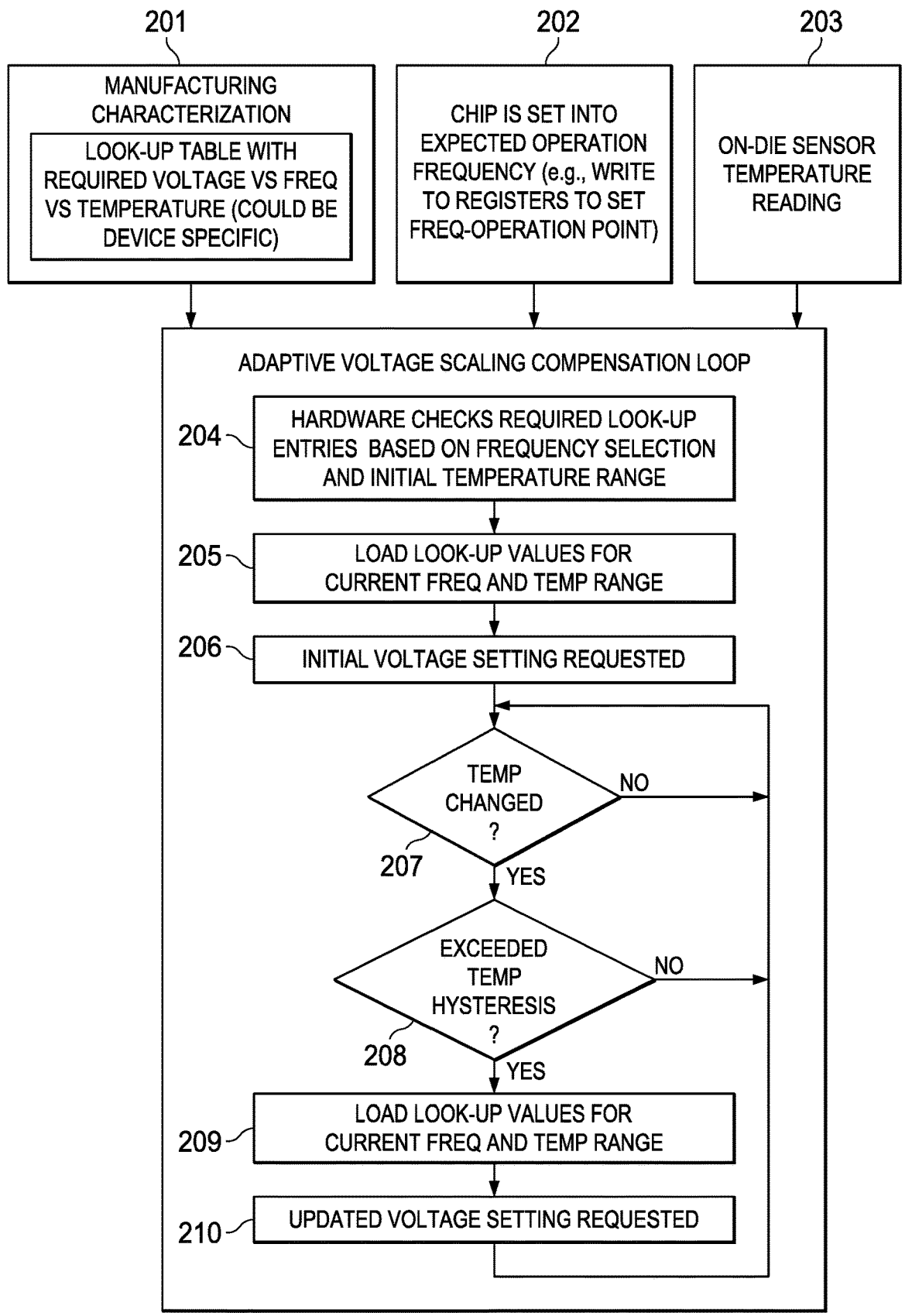
FIG. 2 is a flow chart demonstrating one implementation of adaptive voltage scaling.

FIG. 2 shows one implementation of an adaptive voltage scaling system. Input 201 to the system is the manufacturing characterization data used to generate a lookup table with the required voltage, temperature and operating frequency values. Input 202 initializes the system with the expected operating frequency, and input(s) 203 is the output of the on chip temperature sensors.

Block 204 obtains the appropriate lookup table entries based on the initial expected frequency and the initial temperature range;

Block 205 loads the values from the lookup table based on the current frequency and temperature range;

Block 206 requests the initial operating voltage setting from the power supply based on the above data;

Comparator 207 determines whether the die temperature has changed from the previous value. If it has not, control returns to the input of comparator 207. If the temperature has changed, control flows to comparator 208.

Comparator 208 determines whether the temperature change detected by comparator 207 is larger than a preset hysteresis band. If it is not, control returns to the input of comparator 207. If the change exceeds the hysteresis band, block 209 gets the lookup table values for the current frequency and temperature range, and block 210 requests the updated voltage setting from the power supply. Control then returns to the input of comparator 207.

Figure 3:
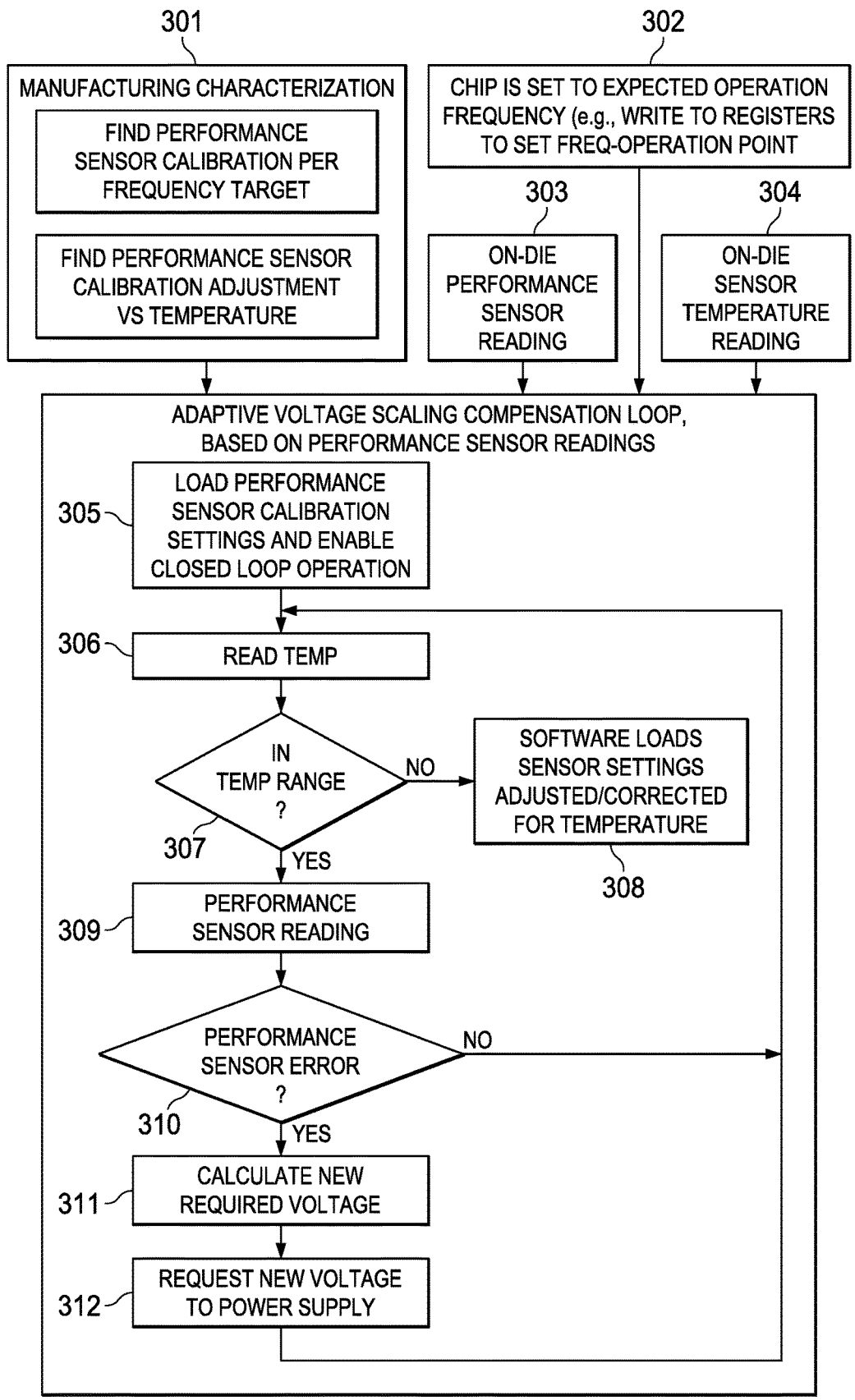
FIG. 3 shows a flow chart of a second implementation.

A second implementation is shown in FIG. 3 where blocks 301 through 304 generate the inputs to the adaptive voltage scaling system.

Block 301 generates the manufacturing characterization data. It determines the performance sensor calibration for the operating frequency targets, and also the performance sensor calibration adjustment dependent on temperature.

Block 302 sets the expected operating frequency. Block 303 provides the on die performance sensor reading, and Block 304 provides the on die temperature reading.

Block 305 loads the performance sensor calibration settings, and enables closed loop operation of the adaptive voltage scaling system.

The current die temperature is read in Block 306, and comparator 307 determines whether the reading is within the preset temperature range. If not, Block 308 loads updated sensor settings corrected for the actual temperature. If the temperature is in range, Block 309 reads the performance sensor, and comparator 310 determines whether there is a performance sensor error. If there is none, control flow returns to Block 306. If there is an error, the required operating voltage to correct the error is calculated in Block 311, and Block 312 requests the updated voltage from the power supply. Control flow then returns to Block 306.

Figure 1:
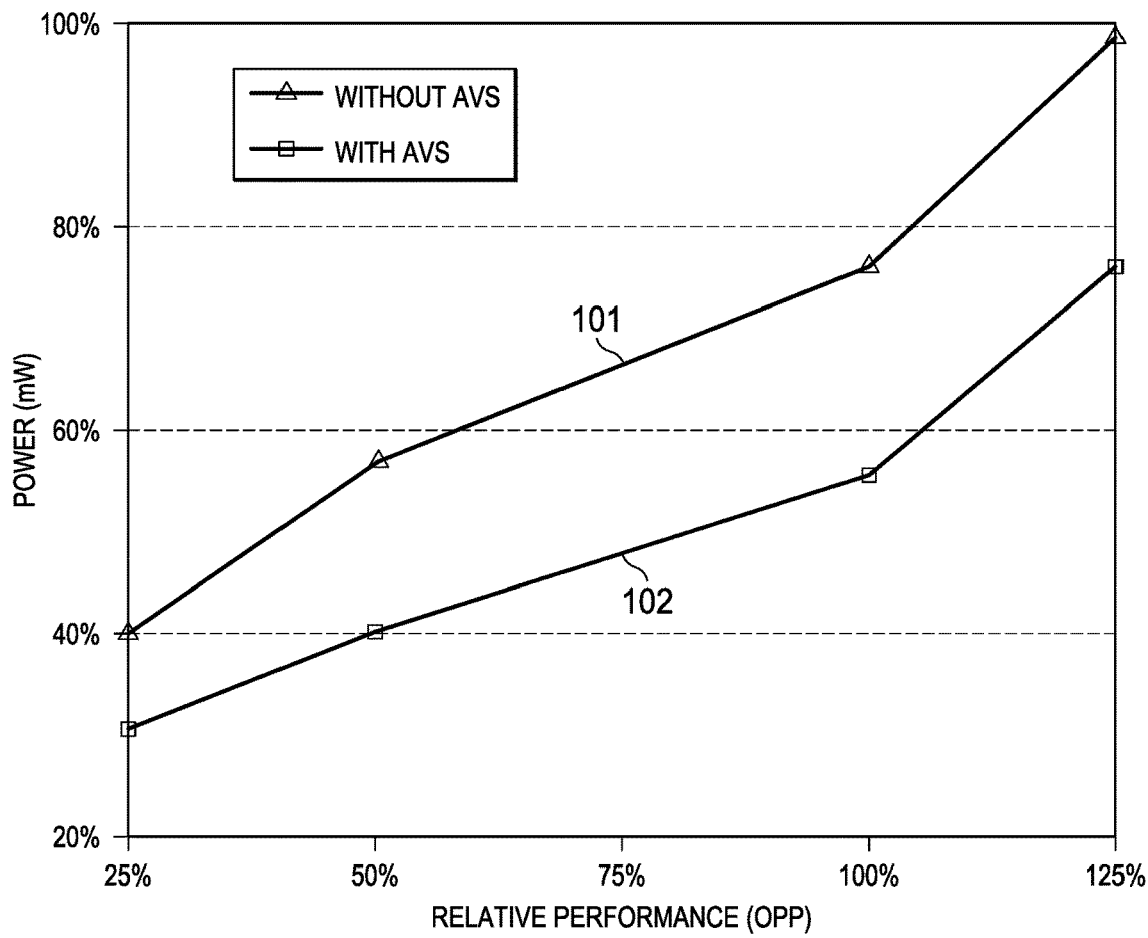
FIG. 1 is a graph demonstrating the power savings attributable to adaptive voltage scaling.
Figure 4:
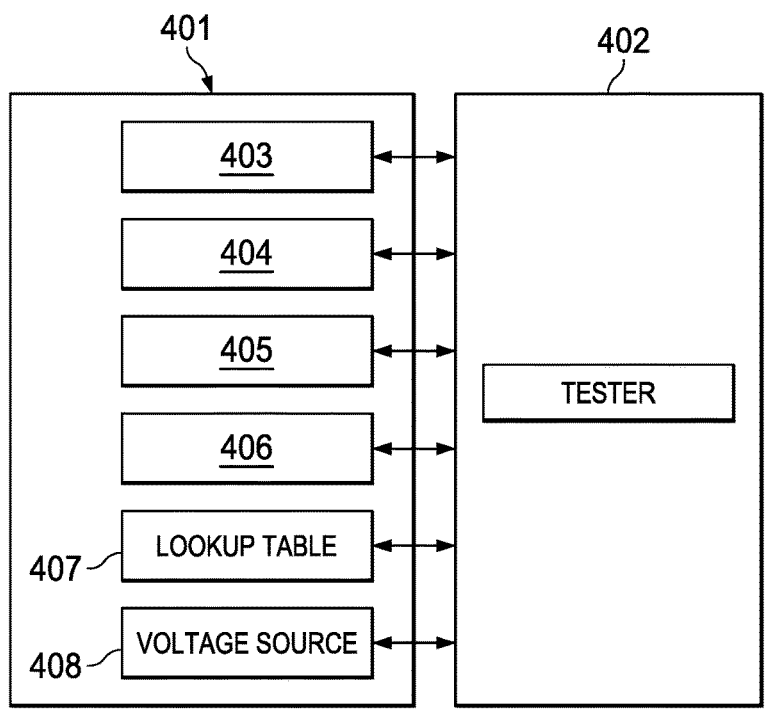
FIG. 4 shows the manufacturing characterization process.

FIG. 4 shows the manufacturing characterization steps used in the invention, where 401 is the die under test and characterization, and 402 is the testing equipment. In the first implementation described above, tester 402 reads the temperature of die 401 using the output of temperature sensor 405 and/or temperature sensor 406. Lookup table 407 is generated by the tester using the temperature readings at a range of temperatures and the appropriate voltage for each temperature, and is then written into lookup table 407 on the die. During operation of the completed part, voltage source 408 is adjusted by the method of this invention based on the measured temperature and the contents of the lookup table.

In the second implementation described, one or more performance sensors 403-404 are also incorporated on the die. These performance sensors are typically implemented as free running ring oscillators, whose frequency is determined by the propagation delays of the gates in the oscillator. Since these delays are influenced by manufacturing and material tolerances, the resulting frequency will be representative of the "strength" of the particular die under test.

In this implementation, lookup table 407 is generated by the tester, and contains calibration data for performance sensor 403 and 404 based on a range of temperatures as measured by temperature sensor 405 and/or temperature sensor 406.

During operation of the completed part, performance sensor 403 and 404 are calibrated using calibration data contained in the lookup table according to the die temperature measured by sensors 405 and/or 406. Voltage source 408 is then adjusted by the method of this invention according to the performance measured by performance sensor 403 and/or 404.

What is claimed is:

1. A semiconductor device comprising:
   a semiconductor die that includes:
   a logic circuit;
   a power supply voltage source to supply a power supply voltage to the logic circuit;
   a temperature sensor;
   a performance sensor;
   a memory to store a set of data including first calibration data that correlates calibration settings of the performance sensor with respective operating frequency frequencies of the logic circuit and second calibration data that correlates the calibration settings of the performance sensor with respective die temperature ranges, wherein the set of data is representative of minimum power supply voltages indexed by respective ranges of the operating frequencies and respective ranges of the die temperatures in a lookup table stored in the memory; and
   adaptive voltage scaling circuitry configured to:
   receive an expected operating frequency of the logic circuit;
   receive an initial performance metric based on a measurement by the performance sensor;
   receive an initial temperature of the die based on a measurement by the temperature sensor;
   load the first and second calibration data;
   set the performance sensor to a calibration setting based on the expected operating frequency of the logic circuit using the first calibration data;
   determine a current die temperature based on a measurement by the temperature sensor;
   determine whether the current die temperature is within the die temperature range associated with the calibration setting based on the second calibration data;
   in response to the current die temperature being within the die temperature range associated with the calibration setting, determine a current performance metric based on a measurement by the performance sensor;
   in response to the current die temperature not being within the die temperature range associated with the calibration setting, load updated first calibration data to the lookup table for the current die temperature;
   determine that the current performance metric does not match an expected performance metric based at least partially on the current die temperature and indicate a performance sensor error; and
   identify an updated power supply voltage for correcting the performance sensor error as a voltage entry of the lookup table that corresponds to a current operating frequency and the current die temperature, and cause a current power supply voltage supplied by the power supply voltage source to be changed to the updated power supply voltage.

2. The semiconductor device of claim 1, wherein the performance sensor comprises a free running ring oscillator.

3. The semiconductor device of claim 1, wherein the semiconductor die comprises a register to store the expected performance metric.

4. The semiconductor device of claim 1, wherein the temperature sensor comprises an analog temperature sensor.

5. The semiconductor device of claim 1, wherein the adaptive voltage scaling circuitry is configured to update the calibration setting of the performance sensor in response to the current semiconductor die temperature being outside the temperature range associated with the calibration setting using the second calibration data.

6. An integrated circuit comprising:
a logic circuit disposed on a substrate;
a power supply voltage source to supply a power supply voltage to the logic circuit;
a temperature sensor disposed on the substrate;
a performance sensor disposed on the substrate;
a memory to store a set of data including first calibration data that correlates calibration settings of the performance sensor with respective operating frequencies of the logic circuit and second calibration data that correlates the calibration settings of the performance sensor with respective substrate temperature ranges, wherein the set of data is representative of minimum power supply voltages indexed by respective ranges of the operating frequencies and respective ranges of the substrate temperatures in a lookup table stored in the memory; and
adaptive voltage scaling circuitry configured to:
receive an expected operating frequency of the logic circuit;
receive an initial performance metric based on a measurement by the performance sensor;
receive an initial temperature of the substrate based on measurement by the temperature sensor;
load the first and second calibration data;
set the performance sensor to a calibration setting based on the expected operating frequency of the logic circuit using the first calibration data;
determine a current substrate temperature based on a measurement by the temperature sensor;
determine whether the current substrate temperature is within a temperature range associated with the calibration setting based on the second calibration data;
in response to the current substrate temperature being within the associated temperature range of the calibration setting, determine a current performance metric based on a measurement by the performance sensor;
in response to the current substrate temperature not being within the associated temperature range of the calibration setting, load updated first calibration data to the lookup table for the current substrate temperature;
determine that the current performance metric does not match an expected performance metric based at least partially on the current substrate temperature and indicate a performance sensor error; and
identify an updated power supply voltage for correcting the performance sensor error as a voltage entry of the lookup table that corresponds to a current operating frequency and the current substrate temperature, and cause a current power supply voltage supplied by the power supply voltage source to be changed to the updated power supply voltage.

7. The integrated circuit of claim 6, wherein the performance sensor comprises a free running ring oscillator.

8. The integrated circuit of claim 6 further comprising a register to store the expected performance metric.

9. The integrated circuit of claim 6, wherein the temperature sensor comprises an analog temperature sensor.

10. The integrated circuit of claim 6, wherein the adaptive voltage scaling circuitry is configured to update the calibration setting of the performance sensor in response to the current semiconductor die temperature being outside the temperature range associated with the calibration setting using the second calibration data.

11. A method comprising:
receiving an expected operating frequency of a logic circuit disposed on a semiconductor die;
receiving an initial performance metric based on a measurement by a performance sensor disposed on the semiconductor die;
receiving an initial temperature of the die based on a measurement by a temperature sensor disposed on the semiconductor die;
load first and second calibration data, in which the first calibration data correlates calibration settings of the performance sensor with respective operating frequencies of the logic circuit and the second calibration data correlates the calibration settings with respective semiconductor die temperature ranges, wherein the first and second calibration data are part of a set of data that is representative of minimum power supply voltages indexed by respective ranges of the operating frequencies and respective ranges of the semiconductor die temperatures in a lookup table stored in a memory disposed on the semiconductor die;
setting the performance sensor to a calibration setting based on the expected operating frequency of the logic circuit using the first calibration data;
determining a current temperature of the semiconductor die using the temperature sensor;
determining whether the current semiconductor die temperature is within a temperature range associated with the calibration setting using the second calibration data;
in response to the current semiconductor die temperature being within the temperature range associated with the calibration setting, determining a current performance metric of the semiconductor die using the performance sensor;
in response to the current semiconductor die temperature not being within the temperature range associated with the calibration setting, load updated first calibration data to the lookup table for the current semiconductor die temperature;
determining that the current performance metric does not match an expected performance metric based at least partially on the current semiconductor die temperature and indicate a performance sensor error; and
identifying an updated power supply voltage for correcting the performance sensor error as a voltage an entry of the lookup table that corresponds to a current operating frequency and the current semiconductor die temperature, and causing a current power supply voltage supplied by a power supply voltage source of the semiconductor die to be changed to the updated power supply voltage.

12. The method of claim 11, wherein the performance sensor comprises a free running ring oscillator.

13. The method of claim 11, wherein the temperature sensor comprises an analog temperature sensor.

14. The method of claim 11, comprising storing the expected performance metric in a register prior to determining that the current performance metric does not match the expected performance metric.

15. The method of claim 11, further comprising updating the calibration setting of the performance sensor in response to the current semiconductor die temperature being outside the temperature range associated with the calibration setting using the second calibration data.

* * * * *